(12) United States Patent
Tanabe et al.

(10) Patent No.: US 9,829,789 B2
(45) Date of Patent: Nov. 28, 2017

(54) METHOD FOR DETERMINING PATTERN OF MOLD FOR IMPRINT, IMPRINT METHOD, AND APPARATUS

(71) Applicant: CANON KABUSHIKI KAISHA, Tokyo (JP)

(72) Inventors: Masayuki Tanabe, Utsunomiya (JP); Setsuo Yoshida, Saitama (JP); Keita Sakai, Utsunomiya (JP); Hitoshi Nakano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 401 days.

(21) Appl. No.: 14/531,777

(22) Filed: Nov. 3, 2014

(65) Prior Publication Data

US 2015/0123300 A1    May 7, 2015

(30) Foreign Application Priority Data

Nov. 6, 2013    (WO) .................. PCT/JP2013/079962

(51) Int. Cl.

| G03F 7/00 | (2006.01) |
| B29C 33/38 | (2006.01) |
| G05D 21/02 | (2006.01) |
| B29C 43/02 | (2006.01) |
| B29C 59/02 | (2006.01) |

(52) U.S. Cl.
CPC ........ *G03F 7/0002* (2013.01); *B29C 33/3835* (2013.01); *B29C 33/3842* (2013.01); *B29C 43/021* (2013.01); *G05D 21/02* (2013.01); *B29C 2043/025* (2013.01); *B29C 2059/023* (2013.01); *B29K 2995/0027* (2013.01)

(58) Field of Classification Search
CPC ...................................................... G03F 7/0002

USPC ..... 425/174.4, 171, 385, 397, 210; 264/494, 264/496, 82, 85, 293
See application file for complete search history.

(56) References Cited

U.S. PATENT DOCUMENTS

| 7,090,716 | B2 * | 8/2006 | McMackin | ............ | B82Y 10/00 264/102 |
| 8,672,663 | B2 * | 3/2014 | Tanabe | .................. | B82Y 10/00 264/293 |
| 2012/0199997 | A1 * | 8/2012 | Tanabe | .................. | B82Y 10/00 264/82 |

FOREIGN PATENT DOCUMENTS

| JP | 2004-103817 A | 4/2004 |
| JP | 2012-164785 A | 8/2012 |
| JP | 2012-236371 A | 12/2012 |
| JP | 2013-055157 A | 3/2013 |

(Continued)

*Primary Examiner* — Benjamin Schiffman
(74) *Attorney, Agent, or Firm* — Canon USA, Inc., IP Division (57) ABSTRACT

A determination method for determining a pattern of a mold is disclosed. The pattern of the mold is used in imprint processing of forming a pattern on imprint material by performing the steps of pressing the imprint material on a substrate against the pattern of the mold in an atmosphere containing condensable gas to be liquefied due to compression, curing the imprint material, and releasing the mold from the imprint material. A processor calculates a shrinkage amount of the pattern on the imprint material. The pattern on the imprint material shrinks by desorbing condensate liquid, which is produced through liquefaction of the condensable gas between the imprint material and the pattern of the mold in the pressing step and which is dissolved in the imprint material, from the imprint material after completion of the pressing step.

9 Claims, 7 Drawing Sheets

(56) References Cited

FOREIGN PATENT DOCUMENTS

| | | |
|---|---|---|
| JP | 2013-074258 A | 4/2013 |
| JP | 2013-168645 A | 8/2013 |
| WO | 2009/153925 A1 | 12/2009 |

* cited by examiner

METHOD FOR DETERMINING PATTERN OF MOLD FOR IMPRINT, IMPRINT METHOD, AND APPARATUS

TECHNICAL FIELD

The present disclosure relates to a method for determining a pattern of a mold for imprint, an imprint method, and an apparatus.

BACKGROUND ART

Attention is being given to an imprint technology of molding a resin (imprint material) on a substrate by using the pattern of a mold (a mold, an original, a mask) and forming a resin pattern on the substrate (such as a wafer or a glass substrate). This technology enables a fine structure on the order of a few nanometers to be created on a substrate. Examples of an imprint technology include a photo-curing method, a thermal-curing method, and a sol-gel imprint method. For example, an imprint apparatus employing the photo-curing method applies an ultraviolet curable resin (an imprint resin, a photo-curable resin) to a shot area (imprint area) on a substrate. Then, the uncured resin is molded by using a mold. After ultraviolet rays are emitted so that the resin is cured, the mold is released, whereby a resin pattern is formed on the substrate.

In Japanese Patent Laid-Open No. 2004-103817, an imprint apparatus is disclosed which uses condensable gas that is condensed and liquefied by a pressure rise (compression) occurring when a mold is pressed against a resin in an imprint atmosphere. When the condensable gas is liquefied, the volume is reduced to several hundredth of that produced when the condensable gas remains in gaseous form. Therefore, an effect which affects pattern formation and which is produced by residual gas between the mold and the substrate which are pressed against each other may be suppressed.

The following state has been found. In imprint processing in the atmosphere containing condensable gas, the condensate liquid having been absorbed into the resin is desorbed from the resin to the outside after completion of the pressing. Therefore, the pattern formed on the substrate may shrink, so that the pattern shape is degraded. For example, pattern line widths are reduced, the degree of roughness of the surface becomes larger, and/or the pattern shape is deformed into a shape which is not a rectangle.

An object of the present invention is to form a pattern on a substrate with accuracy higher than that in the related art, in imprint processing in an atmosphere containing condensable gas.

SUMMARY

According to an aspect disclosed herein for solving the above-described problem, there is provided a determination method for determining a pattern of a mold. The pattern of the mold is used in imprint processing of forming a pattern on imprint material by performing the steps of pressing the imprint material on a substrate against the pattern of the mold in an atmosphere containing condensable gas to be liquefied due to compression, curing the imprint material, and releasing the mold from the imprint material. The method includes the steps of: by using a processor, calculating a shrinkage amount of the pattern on the imprint material, the pattern on the imprint material shrinking by desorbing condensate liquid from the imprint material after completion of the pressing step, the condensate liquid being produced through liquefaction of the condensable gas between the imprint material and the pattern of the mold in the pressing step and being dissolved in the imprint material; and determining a size of the pattern of the mold by using the calculated shrinkage amount.

Further features of the present invention will become apparent from the following description of exemplary embodiments with reference to the attached drawings.

DESCRIPTION OF EMBODIMENTS

First Embodiment

Figure 1:
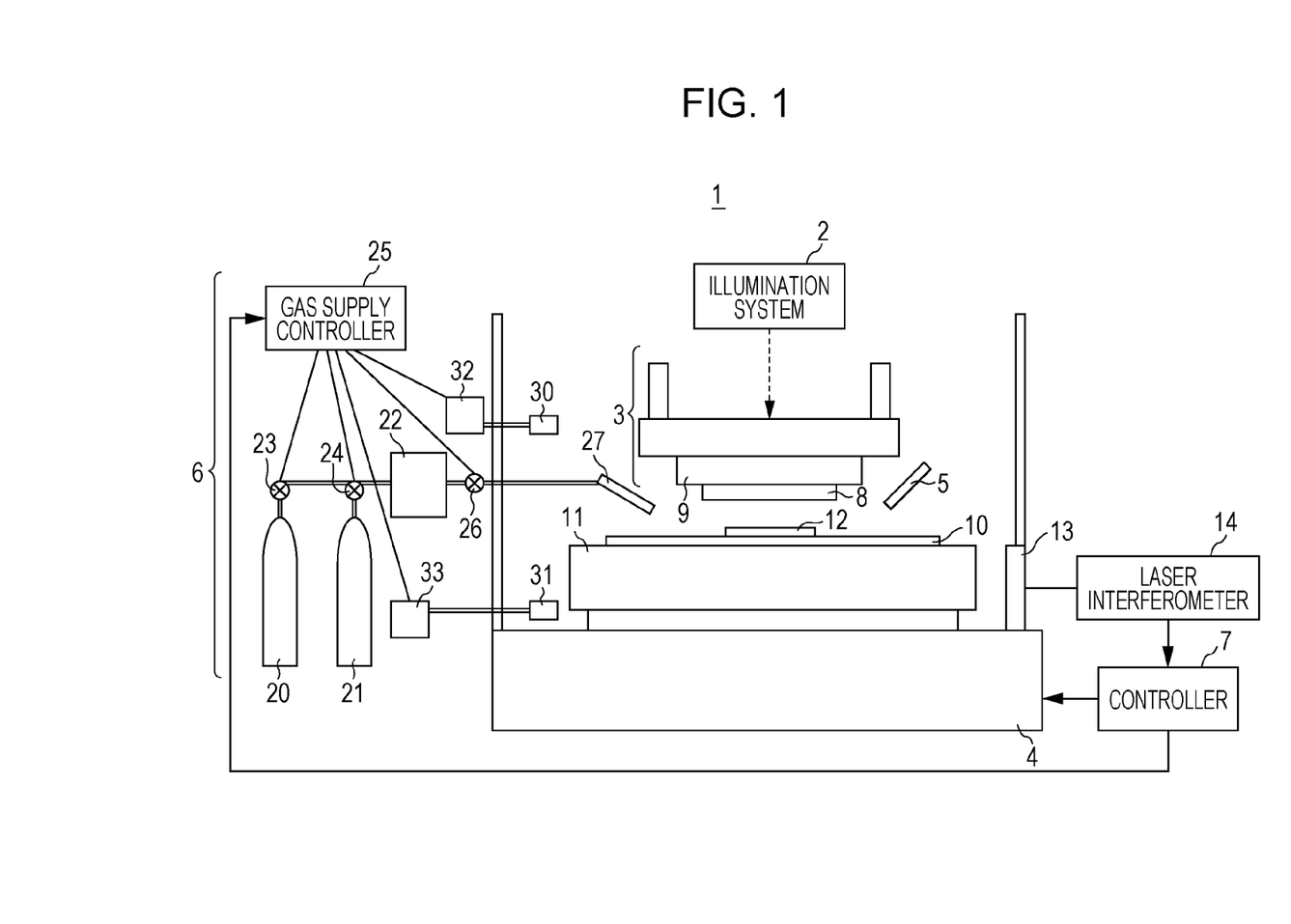
FIG. 1 is a schematic diagram illustrating the configuration of an imprint apparatus according to a first embodiment.

FIG. 1 is a schematic diagram illustrating the configuration of an imprint apparatus. The imprint apparatus is an apparatus which forms a resin pattern on a substrate by pressing a mold pattern against a resin (imprint material) on a substrate which is to be processed, and then releasing the mold from the resin. According to the present embodiment, an imprint apparatus employing a photo-curing method is used. The present embodiment may be applied to other imprint methods such as a thermal-curing method. In FIG. 1, the Z axis is set to be parallel to the optical axis of an illumination system irradiating the resin on the substrate with ultraviolet rays, and the X and Y axes are set to be orthogonal to each other on a plane perpendicular to the Z axis. An imprint apparatus 1 includes an illumination system 2, a mold holding unit 3, a substrate stage 4, an applying unit 5, a gas supply unit 6, and a controller 7.

The illumination system 2 irradiates a resin 12 with ultraviolet rays through a mold 8 in order to cure the resin 12 in imprint processing. The illumination system 2 includes a light source and an optical device for adjusting ultraviolet rays emitted from the light source to light suitable for the curing.

The mold 8 is a mold on which a predetermined pattern (for example, a recess/protrusion pattern corresponding to a circuit pattern) is formed in three dimensions on a surface facing a substrate 10. The material of the mold 8 is one, such as quartz, through which ultraviolet rays may pass.

An alignment mark detection system (not illustrated) is present adjacent to or in the vicinity of the illumination system 2, or inside the illumination system 2. The alignment mark detection system detects an alignment mark on the substrate 10 which is formed in an imprint process for the groundwork and an alignment mark on the mold 8 in order to align the positions of the mold and the substrate.

The mold holding unit 3 is a holding unit which pulls the mold 8 with a vacuum attraction force or an electrostatic force so as to hold the mold 8, and is supported by the structure of the imprint apparatus. The mold holding unit 3 includes a mold chuck 9 and a driving mechanism (not illustrated) for moving the mold holding unit 3 in the Z axis direction. The driving mechanism causes the mold holding unit 3 to move in the Z axis direction so that an operation of pressing the pattern of the mold 8 against the resin 12 applied on the substrate 10 and an operation of releasing the mold from the resin 12 are performed. The operations of pressing and releasing the mold, which are performed in the imprint apparatus 1, may be achieved by moving the mold 8 in the Z axis direction as described above. However, for example, the operations may be achieved by moving the substrate stage 4 (substrate 10) in the Z axis direction, or by moving both of the mold 8 and the substrate stage 4.

The substrate stage 4 is a holding unit that holds the substrate 10, for example, with vacuum attraction and that includes a substrate chuck 11 which is movable in the XY plane. The substrate 10 is a target which is to be processed and which is composed of, for example, single-crystal silicon, and has a surface which is to be processed and to which the resin 12 that is to be molded by using the mold 8 is applied. The substrate stage 4 is provided with multiple reference mirrors (reflecting unit) 13 in the vicinity of the substrate stage 4 so that the position and the angle of the substrate stage 4 may be controlled by six degrees of freedom (X, Y, Z, ωx, ωy, ωz). The imprint apparatus 1 includes multiple laser interferometers (measuring means) 14 which measure the position of the substrate stage 4 by irradiating these reference mirrors 13 with respective beams. The laser interferometers 14 measure the position of the substrate stage 4 in real time, and the controller 7 performs positioning control on the substrate 10 (substrate stage 4) on the basis of the measurement value.

The applying unit 5 is applying means for applying the resin 12 (uncured resin) to the substrate 10. The resin 12 is a photo-curable resin having a property of being cured by receiving ultraviolet rays. The resin 12 is selected as appropriate depending on, for example, a process of manufacturing a product (device) to be manufactured, and is applied to the substrate.

The gas supply unit 6 is supply means (supply unit) which, in an operation of pressing the mold 8 and the resin 12 on the substrate 10 against each other, supplies mixed gas toward the mold-pressing position at which the mold is pressed. The gas supply unit 6 includes a permeable gas supply unit 20 which supplies permeable gas having a property of being dissolved or diffused in at least one of the mold 8, the resin 12, and the substrate 10. The gas supply unit 6 also includes a condensable gas supply unit 21 which supplies condensable gas having a property of being condensed and liquefied by applying a pressure (pressure rise, compression).

Gas, such as helium or hydrogen, may be employed as the permeable gas. When hydrogen which is combustible is used as the permeable gas, an explosion-proof system needs to be separately provided in the imprint apparatus 1 so that fire does not break out. As the condensable gas, gas whose boiling point is equal to or larger than 15° C. and equal to or smaller than 30° C. in atmospheric pressure, or whose steam pressure is equal to or larger than 0.05 MPa and equal to or smaller than 1.00 MPa at room temperature may be employed. For example, HFC-245fa (1,1,1,3,3-pentafluoropropane, CHF2CH2CF3) may be employed. In addition to HFCs (hydrofluorocarbons), HFEs (hydrofluoroethers), HFOs (hydrofluoroolefins), and the like may be employed.

The gas supply unit 6 includes a gas mixing unit 22 which mixes a gas supplied from the permeable gas supply unit 20 with a gas supplied from the condensable gas supply unit 21, and a gas supply controller 25 which controls the amount of supply of each of the gases to be supplied to the gas mixing unit 22 by using a first valve 23 and a second valve 24. The gas supply controller 25 is an adjusting unit which supplies the mixed gas produced by mixing the gases at a desired component ratio in the gas mixing unit 22, toward the mold-pressing position located between the mold 8 and the substrate 10 from a gas supply nozzle 27 while the supply amount of the mixed gas is adjusted by controlling a third valve 26. The gas supply controller 25 may be separately provided in the imprint apparatus 1 in such a manner as to be connected to the controller 7 described below through a line, or may be integrated with the controller 7.

When the mixed gas produced by using the permeable gas and the condensable gas is supplied toward the mold-pressing position, gas recovery nozzles 30 and 31 may be provided at two positions in the imprint apparatus 1. The first gas recovery nozzle 30 is provided at a position higher than the mold-pressing position in the direction of gravity, and the second gas recovery nozzle 31 is provided at a position lower than the mold-pressing position. The gas recovery nozzles 30 and 31 are connected to first and second gas recovery units 32 and 33, respectively. In this configuration, the gas recovered by the first gas recovery unit 32 has a higher abundance ratio of the permeable gas having small gravity. In contrast, the gas recovered by the second gas recovery unit 33 has a higher abundance ratio of the condensable gas having large gravity. Therefore, the permeable gas and the condensable gas which are separated from each other in the imprint apparatus 1 may be efficiently recovered, having an advantage in terms of gas recycle.

The controller 7 may control operations, adjustment, and the like of each of the components in the imprint apparatus 1. The controller 7 which is constituted by a computer or the like is connected to each of the components of the imprint apparatus 1 via a line, and may exert control over each of the components according to programs or the like. In the present embodiment, the controller 7 controls the operations of the laser interferometers 14 and the alignment detection system (not illustrated) in addition to the operations of the mold holding unit 3, the substrate stage 4, and the like. The controller 7 may be integrated with other components of the imprint apparatus 1, or may be installed at a position different from those of other components of the imprint apparatus 1.

Imprint processing performed by the imprint apparatus 1 will be described. The controller 7 causes the substrate 10 to be put and fixed on the substrate stage 4 by using a substrate transport apparatus (not illustrated), and then causes the substrate stage 4 to move to the position at which the applying unit 5 performs an applying operation. After that, as an applying process, the applying unit 5 applies the resin (uncured resin) 12 to a predetermined shot (imprint area) on the substrate 10. Then, the controller 7 causes the substrate stage 4 to move to a predetermined position so that the shot on the substrate 10 is located directly below the mold 8. After the controller 7 performs alignment of the mold 8 and the shot on the substrate 10, magnification correction for the mold 8 which is performed by a magnification correction mechanism (not shown), and the like, the controller 7 drives a mold driving mechanism to cause the mold 8 to be pressed against the resin 12 on the substrate 10 (pressing process). This pressing process causes the resin 12 to be filled in the recess portions of the pattern formed on the mold 8. In this state, as a curing process, the illumination system 2 emits ultraviolet rays from the back surface (top surface) of the mold 8, so that the ultraviolet rays passing through the mold 8 cause the resin to be cured. After the resin 12 is cured, the controller 7 drives the mold driving mechanism again to cause the mold 8 to be released from the substrate 10 (releasing process). Thus, a three-dimensional pattern of the resin 12 is formed on the surface of the shot on the substrate 10.

In at least the pressing process in the above-described imprint processing, the condensable gas is supplied to a space between the substrate and the mold, and the pressing process is performed in an atmosphere containing the condensable gas. The condensable gas between the substrate and the mold is liquefied due to compression, and the volume of the condensable gas is reduced up to several hundredth of that produced when the condensable gas remains in gaseous form, achieving suppression of the effect affecting the pattern formation due to the residual gas. Absorption of the condensate liquid, which is produced from the liquefied condensable gas, into the resin 12 reduces the viscosity of the resin 12. Therefore, the resin spreads at a higher speed into the recess portions of the mold pattern when the mold is pressed, resulting in an advantage in that the pattern formation is completed in a short time.

However, in the imprint processing in an atmosphere containing the condensable gas, after completion of the pressing process, for example, when the resin starts being exposed to the atmosphere after the mold is released, the condensate liquid having been absorbed into the resin 12 is desorbed from the resin 12 to the outside. Therefore, the resin pattern formed on the substrate may shrink, resulting in degradation in the pattern shape of the resin. The higher the concentration of the condensable gas is, the stronger this tendency is. In contrast, the higher the concentration of the condensable gas is, the shorter the pattern formation time is. Therefore, there is a tradeoff relationship between accuracy in transferring a shape from a mold pattern to a resin pattern and apparatus productivity (throughput).

Figure 2:
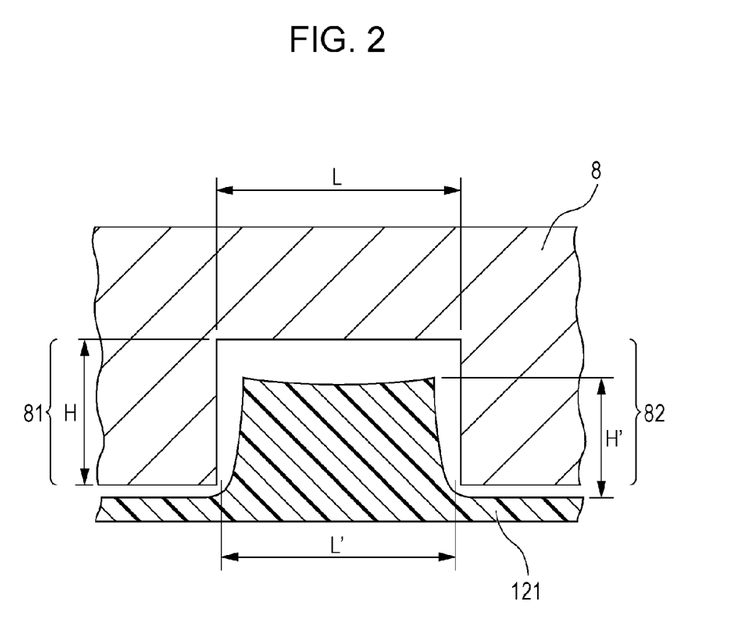
FIG. 2 is a diagram which schematically illustrates a pattern of a resin which is formed after a mold is released.

FIG. 2 illustrates a protrusion portion 121 of the resin 12 which is formed after the pattern of the mold 8 is released from the resin 12. In FIG. 2, for the sake of comparison, a recess portion (between a protrusion portion 81 and a protrusion portion 82) of the mold 8, which is used to form the protrusion portion 121 of the resin 12, is illustrated above the protrusion portion 121 of the resin 12. The recess portion of the mold 8 has a line width of L and a height of H. In FIG. 2, the condensate liquid having been absorbed into the resin 12 is desorbed, whereby the protrusion portion 121 of the resin 12 shrinks. Accordingly, the line width of the protrusion portion 121 becomes L' which is smaller than L, and the change amount ΔCD in the line width (CD) is represented as the expression ΔCD=L−L'. The average height of the protrusion portion 121 becomes H' which is smaller than H. The average height is an average of heights at positions on the top surface of the protrusion portion 121.

Figure 3:
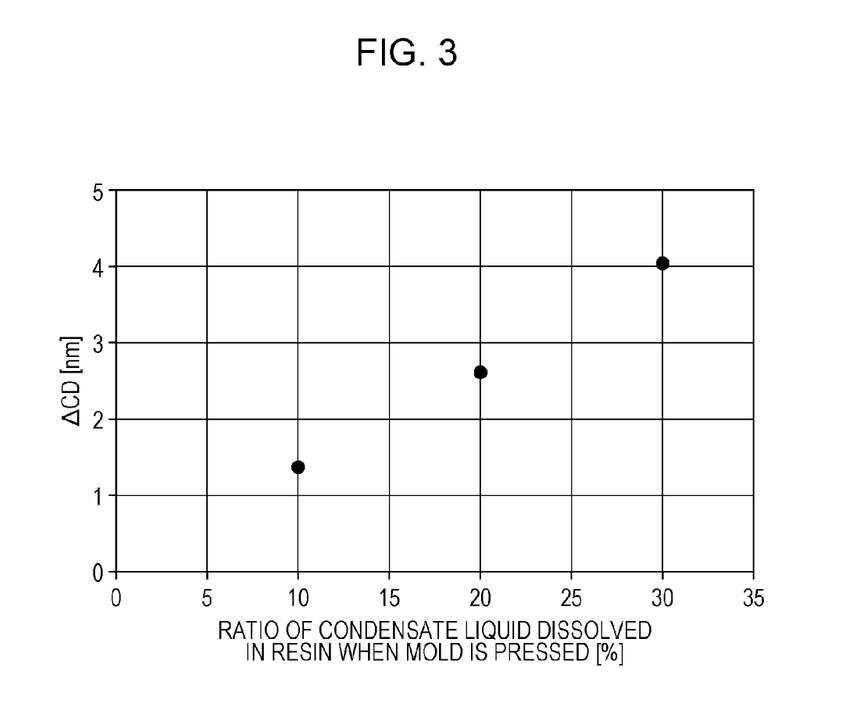
FIG. 3 is a diagram illustrating the relationship between a ratio of condensate liquid dissolved in a resin when a mold is pressed and the amount of a CD change.

The shrinkage of the resin pattern relates to the dissolution amount (concentration) of the condensate liquid dissolved in the resin. FIG. 3 illustrates the relationship between a ratio (concentration) of the condensate liquid which is produced from the condensable gas having been liquefied when the mold is pressed and which has been dissolved in the resin, and the amount of a CD change caused by the pattern shrinkage, with respect to a pattern component having a height of 60 nm and a line width of 100 nm. As illustrated in FIG. 3, there is an approximately linear relationship between a concentration of the dissolved condensate liquid and the amount of a CD change. Therefore, when the concentration of the condensate liquid dissolved in the resin is determined, the shrinkage amount (change amounts in the width and the height) of the resin pattern is obtained.

A method for determining a mold pattern used in the imprint processing will be described. This determination method is performed by using a computer in designing of a mold pattern. The method for determining a mold pattern is performed in such a manner that a computer processor (such as a CPU, an MPU, a DSP, or a FPGA) reads and executes programs and that a computer uses pattern data to perform calculation. The software or programs achieving the functions according to the present embodiment are supplied to an information processing apparatus constituted by one or more computers, via a network or various recording media. The processor of the information processing apparatus reads programs recorded or stored in a recording medium or a storage medium, thereby executing the programs. Multiple computers remotely located may receive/transmit data from/to each other through wired or wireless communication, whereby various processes according to the programs may be performed. The processor of the information processing apparatus constitutes means for executing steps described below.

Figure 4:
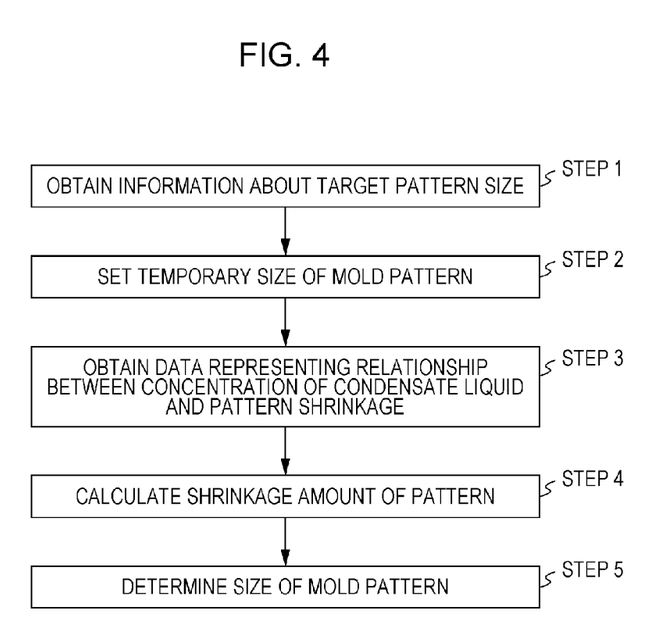
FIG. 4 is a diagram illustrating a method for determining a mold pattern.

FIG. 4 illustrates a flowchart of the method for determining a mold pattern.

The computer obtains information about the size of a target pattern to be formed on the substrate (in step 1). Examples of the information about the size include the widths (longitudinal and transverse widths) and the height (depth) of a pattern, a ratio of the width to the height, a pitch, a radius, and the shape. The size determined by using this determination method may be at least one piece of size information, such as only the width of a pattern or only the height. Then, a temporary size of the mold pattern is set (in step 2). For example, the size of a recess portion of the mold pattern is set to the same size as that of a protrusion portion of the target pattern which is formed by using the recess portion.

The data representing the relationship between the concentration of the condensate liquid which is produced from the condensable gas having been liquefied when the mold is pressed and which has been dissolved in the resin, and the shrinkage of the pattern is obtained (in step 3). Examples of the data about the shrinkage of the pattern include shrinkage amounts (change amounts) of the width and the height of the pattern and a volume shrinkage rate (shrinkage rate per unit volume). This data may be stored in a memory (storage) in the computer in advance, or may be obtained via a line from an external apparatus. The data may be generated by analyzing measurement results obtained in actual imprint processing, or may be generated through calculation in a computer simulation.

The data obtained in step 3 is used to calculate the amount of shrinkage of the resin pattern which is caused by desorption of the condensate liquid, which has been dissolved in the resin, from the resin after completion of a process of pressing the mold against the resin (in step 4). In this step, the calculation is performed by using the temporary size of the mold pattern which is set in step 2, and by setting the concentration of the condensate liquid, which has been dissolved in the resin when the mold is pressed, to a predetermined value.

The shrinkage amount calculated in step 4 is used to change the temporary size of the mold pattern to a larger size so that the size of the pattern formed on the resin matches the target size, and the size of the mold pattern is determined (in step 5). That is, the size of the mold pattern is made larger so that compensation is made by using the calculated shrinkage amount. For example, assume that the size of the target pattern is 30 nm, and that the size corresponding to the shrinkage amount calculated in step 4 is 0.5 nm. In this case, the size of the mold pattern is determined to be a size larger than the size of the target pattern by the size corresponding to the calculated shrinkage amount. That is, the size of the mold pattern is determined to be 30.5 nm which is a size larger than 30 nm by 0.5 nm. The size of the mold pattern may be determined in consideration of an effect related to the pattern formation, such as shrinkage caused by curing of the resin in the curing process. When the size corresponding to the shrinkage amount produced by curing of the resin is 0.4 nm, in the above-described example, the size of the mold pattern is further made larger than 30.5 nm by 0.4 nm which corresponds to the shrinkage amount produced by curing the resin, and is determined to be 30.9 nm.

For magnification correction of the pattern area of the mold, the size of the pattern area may be set to be larger than the pattern area (shot area) on the substrate so that the mold may be slightly shrunk and deformed by pressing the four sides of the mold.

The concentration of the condensate liquid dissolved in the resin when the mold is pressed is proportional to the concentration of the condensable gas in the atmosphere in the imprint processing. Therefore, when only the concentration of the condensable gas in the atmosphere is determined, the concentration of the condensate liquid dissolved in the resin when the mold is pressed may be obtained from the concentration of the condensable gas in the atmosphere. Alternatively, data representing the relationship between the concentration of the condensable gas and the shrinkage amount of the pattern may be obtained in advance, and the data may be used to directly calculate a shrinkage amount of the pattern from the concentration of the condensable gas.

The concentration of the condensable gas in the atmosphere in which the imprint processing is performed is influenced by the placement of the supply port and the recovery port for the condensable gas and the placement of peripheral members, resulting in occurrence of a concentration distribution of the condensable gas in the atmosphere. In addition, a distribution occurs in which the concentration in a center portion is different from that in a peripheral portion in the mold 8. Different concentrations of the condensable gas cause different concentrations of the condensate liquid dissolved into the resin, resulting in different volume shrinkage rates of the resin pattern which are produced when the condensate liquid is desorbed from the resin upon releasing of the mold. That is, the volume shrinkage rates at positions in the pattern formed on the resin are different depending on a concentration distribution of the condensable gas.

Therefore, in the calculation in step 4, the concentration distribution of the condensable gas in the atmosphere may be used to obtain a concentration distribution of the condensate liquid in the pattern area formed on the resin. Then, the concentration distribution of the condensate liquid may be used to calculate the shrinkage amount of each pattern component (position) of the mold. After that, in step 5, the size may be changed and determined for each pattern component.

Figure 5A:
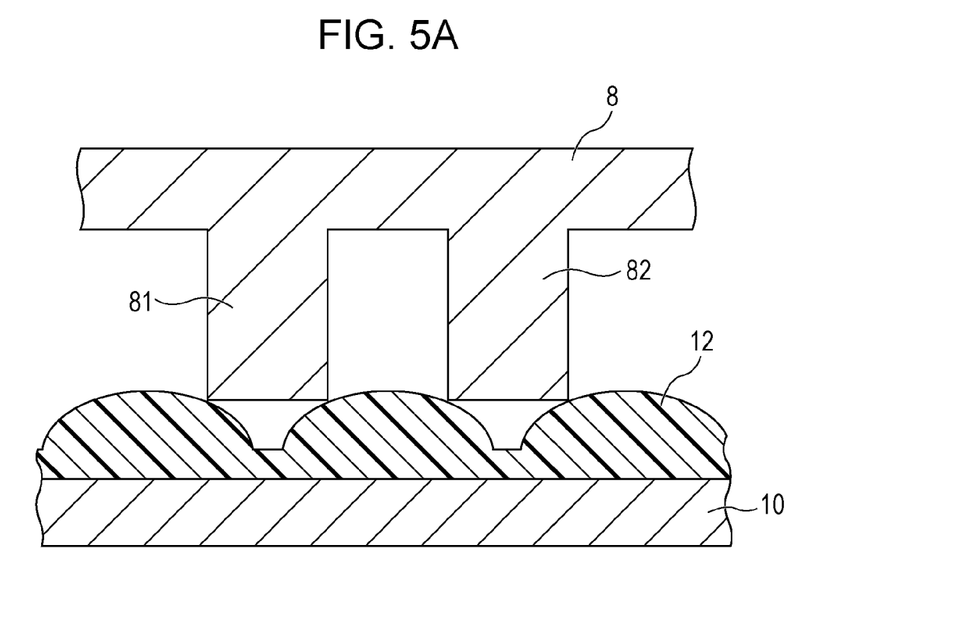
FIGS. 5A and 5B are diagrams which schematically illustrate the shape of a pattern of a mold which is to be pressed and the shape of a resin applied on a substrate.
Figure 5B:
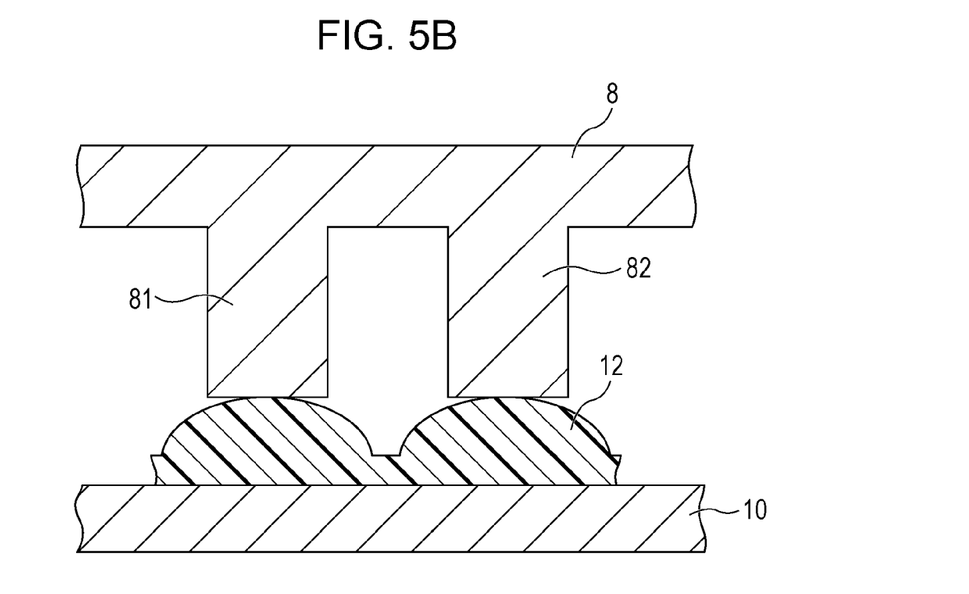

In the case where the mold is deformed for magnification correction when the mold is to be pressed by moving the mold and the substrate close to each other, the shape of the mold may cause different amounts of the condensable gas confined between the mold and the resin, depending on positions. In this case, the concentration of the condensate liquid dissolved into the resin also depends on the positions, and the volume shrinkage rate of the resin pattern which is produced due to the condensate liquid desorbed from the resin when the mold is released depends on the positions. FIGS. 5A and 5B schematically illustrate the cross-section shape of a mold pattern and the shape of a resin applied on the substrate in the case where the mold is deformed for magnification correction, just before the mold is pressed. In FIGS. 5A and 5B, the shape and the size of the mold pattern and the shape and the size of a droplet of the applied resin are the same, but the positions of the protrusion portions of the mold are different because of the deformation of the mold 8. In FIG. 5A, the recess portion between the protrusion portion 81 and the protrusion portion 82 of the mold 8 is located just above the center of a semicircular droplet of the resin 12. In FIG. 5B, each of the protrusion portions 81 and 82 of the mold 8 is located just above the center of a droplet of the resin 12, and the recess portion of the mold 8 is located between two droplets of the resin 12. Thus, the relative position between a protrusion portion (recess portion) of the mold 8 and a droplet of the resin 12 in FIG. 5A is different from that in FIG. 5B. Thus, the space between the recess portion of the mold 8 and the resin 12 in FIG. 5B is larger than that in FIG. 5A, and the amount of the condensable gas confined between the recess portion of the mold 8 and the resin 12 in FIG. 5B is larger than that in FIG. 5A. The amount of gas confined at the position of each of multiple recess portions of the mold 8 may be obtained by using data about the shape, the size, and the placement of each of the mold patterns, data about the shape, the size, and the placement of a droplet of the resin applied to the substrate, and data about the shape of the mold deformed when the mold is to be pressed. In addition, the calculation may be performed by using data about the mold shape used when the mold is pressed. Then, the concentration distribution of the condensate liquid in the pattern area formed on the resin may be obtained by using the amounts of condensable gas confined between the resin and the mold pattern.

Thus, in the calculation in step 4, by using the concentration distribution of the condensable gas in the atmosphere and the amounts of gas confined at the positions of multiple recess portions of the mold, the concentration distribution of the condensate liquid in the resin at positions in the resin pattern may be obtained, and the shrinkage amounts of pattern components at positions may be obtained.

Even under the condition that the concentration of the condensable gas in the atmosphere in the imprint processing is the same, that the dissolution rate of the condensate liquid dissolved into the resin is the same, and that the volume shrinkage rate of the resin due to desorption of the condensate liquid is the same, the shrinkage amount (shrinkage rate) of the size of a pattern to be formed depends on the size of the pattern.

Figure 6A:
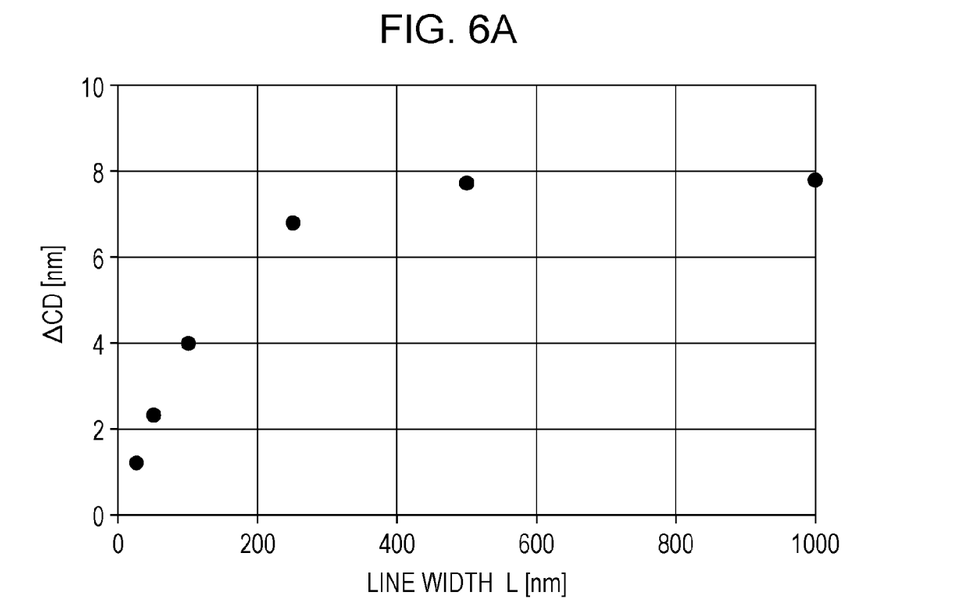
FIG. 6A is a diagram illustrating the relationship between a pattern line width and the amount of a CD change.

FIG. 6A illustrates the relationship between a mold pattern line width L and the amount of a CD change $\Delta CD$ due to the shrinkage of the resin pattern, for a mold pattern having a height of 60 nm, in the case where the condensate liquid is dissolved in the resin up to a concentration of 30%

(the concentration of the condensate liquid in the resin is 30%). FIG. 6A shows that there is an approximately linear relationship between a line width and the amount of a CD change, for a fine pattern having a line width equal to or smaller than 200 nm. However, when the line width becomes 500 nm or larger, the amount of a CD change is substantially the same regardless of the line width.

Figure 6B:
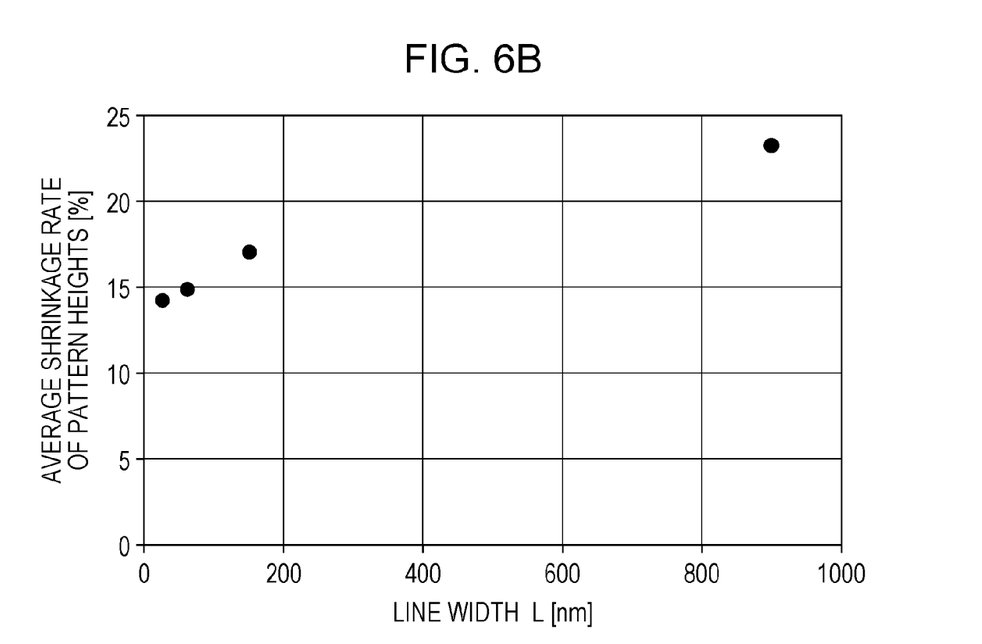
FIG. 6B is a diagram illustrating the relationship between a pattern line width and an average shrinkage rate of pattern heights.

FIG. 6B illustrates the relationship between a mold pattern line width L and the average shrinkage rate of pattern heights produced through the shrinkage of the resin pattern, for a mold pattern having a height of 60 nm, in the case where the condensate liquid is dissolved in the resin up to a concentration of 25% (the concentration of the condensate liquid in the resin is 25%). The average shrinkage rate is the average of the shrinkage rates (shrinkage amount/60 nm) of the height at positions in the top surface of the protrusion portion of the resin pattern. FIG. 6B shows that the larger the line width is, the larger the average shrinkage rate of the pattern height is.

Thus, the shrinkage amount (shrinkage rate) of the resin pattern depends on the pattern size, and may be predicted. Therefore, in the calculation in step 4, for each of multiple pattern components in the mold pattern which have different sizes, the shrinkage amounts of the width and the height of the pattern component which are produced due to desorption of the condensate liquid are calculated. Then, in step 5, for each of the pattern components of the mold, the calculated shrinkage amounts are used to determine the mold pattern size.

That is, in the calculation of the shrinkage amount in step 4, the following steps may be performed. The volume shrinkage rate of each of the pattern components formed on the resin is calculated from local concentrations (concentration distribution) of the condensable gas at positions in the pattern and the amounts of the condensable gas confined in multiple recess portions. Then, the shrinkage amounts (shrinkage rate) of the pattern width and the pattern height are obtained from the calculated volume shrinkage rate so as to reflect the fact that the size of each of the pattern components causes different shrinkage rates of the pattern width and the pattern height. In step 5, the size of each of the pattern components of the mold is adjusted by the shrinkage amounts so as to be determined.

The mold pattern size thus determined may be used to calculate the size of the resin pattern after shrinkage, through a simulation or actual measurement in the imprint processing. The size of the resin pattern may be compared with the target size to determine whether or not the comparison result falls within a predetermined error range. If the determination result indicates that the error is larger than the range, the process of further changing the mold pattern size and the process of performing the determination may be repeated.

As described above, according to the present embodiment, in consideration of the shrinkage amount of the resin pattern which is produced due to desorption of the condensate liquid, which has been dissolved in the resin when the mold is pressed against the substrate, from the resin, the mold pattern size is determined. Therefore, in the imprint processing in an atmosphere containing the condensable gas, the effect affecting the pattern formation due to the shrinkage may be reduced, enabling a pattern to be formed on a substrate with higher accuracy.

Second Embodiment

Figure 7:
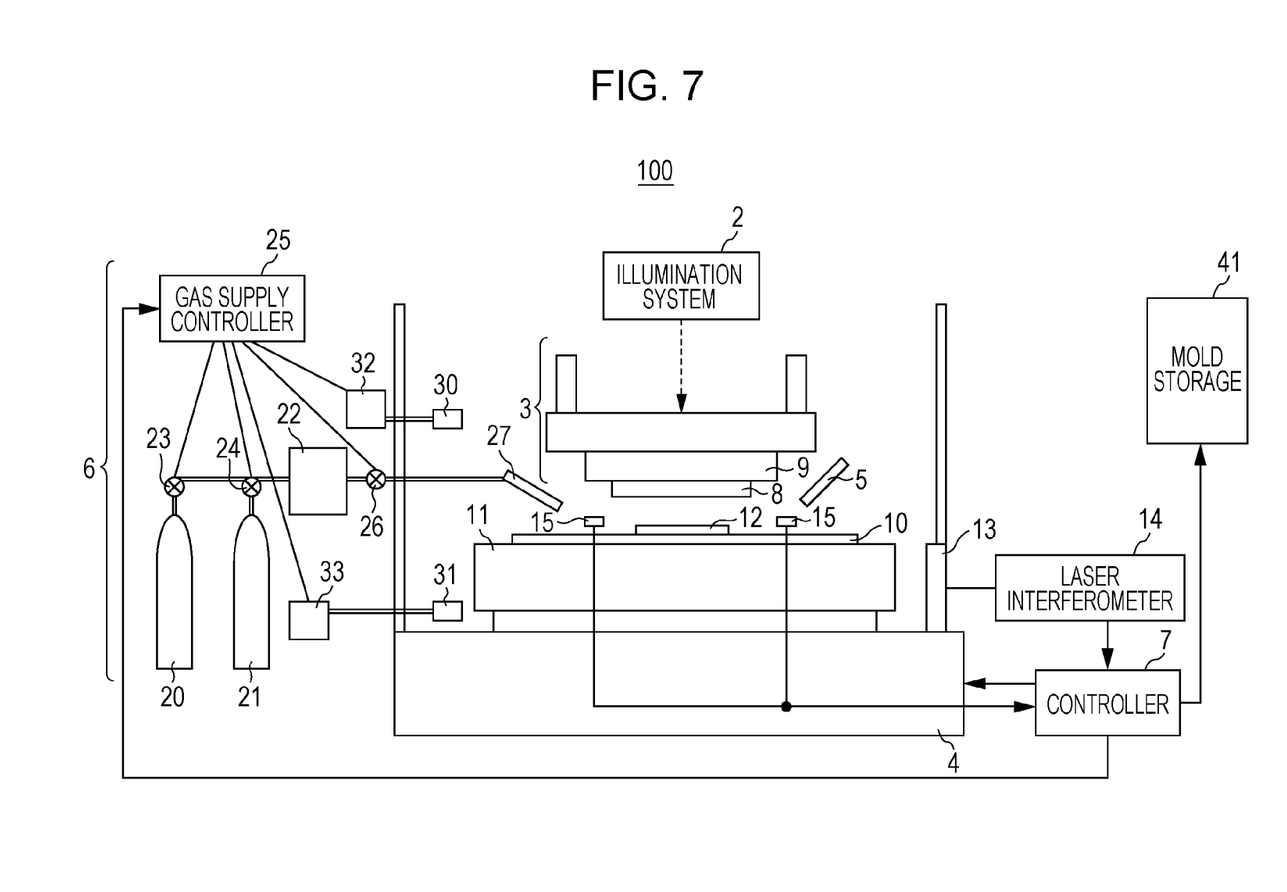
FIG. 7 is a schematic diagram illustrating the configuration of an imprint apparatus according to a second embodiment.

The configuration of an imprint apparatus according to a second embodiment will be described. FIG. 7 is a schematic diagram illustrating the configuration of an imprint apparatus 100 according to the present embodiment. The same configuration as that in the first embodiment will not be described.

The imprint apparatus 100 includes measuring devices (measuring unit) 15 which measure the concentration of the condensable gas in the atmosphere in the apparatus, and a mold storage 41 which stores multiple molds. The multiple molds manufactured to form a target pattern having the same size on the resin on the substrate are manufactured so that the sizes of the mold patterns are different from each other. In addition, the calculation according to the first embodiment may be performed for multiple concentrations by changing the concentration of the condensable gas, and the sizes of the mold patterns may be determined, whereby multiple molds may be manufactured.

According to the present embodiment, the controller (selection unit) 7 uses measurement results of the concentration of the condensable gas measured by the measuring devices 15, and data representing the relationship between the concentration of the condensable gas and the shrinkage of the pattern formed on the resin, so as to select an optimal mold for use among the multiple molds.

As described above, the shrinkage amount of the resin pattern shrinking by desorbing the condensate liquid, which is produced through liquefaction due to compression when the mold is pressed against the substrate and which has been dissolved in the resin, from the resin after completion of the pressing process depends on the concentration of the condensable gas in the atmosphere. Therefore, data representing the relationship between the shrinkage amount and the concentration may be obtained in advance and may be stored in a memory. Alternatively, every time a mold is to be selected, the shrinkage amount may be calculated from the measurement results of the concentration of the condensable gas measured by the measuring devices 15. The calculation method according to the first embodiment may be also used in the calculation of the shrinkage amount.

In consideration of the shrinkage amount, the controller 7 selects a mold having a pattern size which makes the size of the pattern formed on the resin in the imprint processing closest to the size of the target pattern.

The selected mold is transported from the mold storage 41 to the mold holding unit 3 by a mold transport system (not illustrated), and is fixed with the mold chuck 9.

The controller 7 causes the substrate 10 to be put and fixed on the substrate stage 4 by using the substrate transport apparatus (not illustrated), and then causes the substrate stage 4 to move to the position at which the applying unit 5 performs an applying operation. After that, as an applying process, the applying unit 5 applies the resin (uncured resin) 12 to a predetermined shot (imprint area) on the substrate 10. Then, the controller 7 causes the substrate stage 4 to move to a predetermined position so that the shot on the substrate 10 is located directly below the mold 8. After the controller 7 performs alignment of the mold 8 and the shot on the substrate 10, magnification correction for the mold 8 which is performed by the magnification correction mechanism (not shown), and the like, the controller 7 drives the mold driving mechanism to cause the mold 8 to be pressed against the resin 12 on the substrate 10 (pressing process). This pressing process causes the resin 12 to be filled in the recess portions of the pattern formed on the mold 8. In this state, as a curing process, the illumination system 2 emits ultraviolet rays from the back surface (top surface) of the mold 8, so that the ultraviolet rays passing through the mold 8 cause the resin to be cured. After the resin 12 is cured, the controller 7 drives the mold driving mechanism again to cause the mold 8 to be released from the substrate 10 (releasing process). Since the condensate liquid is desorbed from the resin 12, the resin pattern shrinks. The mold has a pattern having a size determined in consideration of the shrinkage. Accordingly, a three-dimensional pattern which is the same or substantially the same as that of the target pattern is formed on the surface of the shot on the substrate 10.

As described above, according to the present embodiment, a mold is selected in consideration of the shrinkage amount of the resin pattern shrinking through desorption of the condensate liquid from the resin. Use of the selected mold enables the target pattern to be formed on the resin with high accuracy.

Third Embodiment

The mold pattern created by using the method for determining a pattern according to the first embodiment described above is subjected to data conversion in accordance with the format of data which is to be input to a mold manufacturing apparatus (drawing apparatus), and the resulting data is input to the mold manufacturing apparatus. The mold manufacturing apparatus draws a pattern on a mold blank on the basis of the input data, and performs etching or the like, manufacturing a mold.

The manufactured mold is transported to the imprint apparatus, and the imprint processing using the mold is performed in the imprint apparatus as described above, and a pattern is formed on the substrate.

[Method for Manufacturing Products]

A method for manufacturing a device (such as a semiconductor integrated circuit device or a liquid-crystal display device) includes a process of forming a pattern on a substrate (a wafer, a glass plate, a film substrate) by using the above-described imprint apparatus. The device manufacturing method may further include a process of etching a substrate on which a pattern is formed. A method for manufacturing another product, such as a patterned medium (recording medium) or an optical device, may include another process of processing a substrate on which a pattern is formed, instead of etching. The product manufacturing method according to the present embodiments has an advantage in terms of at least one of performance, quality, productivity, and production cost of the product, in comparison with a method of the related art.

According to the present invention, a pattern may be formed on a substrate with accuracy higher than that in the related art, in imprint processing in an atmosphere containing condensable gas.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2013/079962, filed Nov. 6, 2013, which is hereby incorporated by reference herein in its entirety.

The invention claimed is:

1. A determination method for determining a pattern of a mold, the pattern of the mold being used in imprint processing of forming a pattern on imprint material by performing the steps of pressing the imprint material on a substrate against the pattern of the mold in an atmosphere containing condensable gas to be liquefied due to compression, curing the imprint material, and releasing the mold from the imprint material, the method comprising the steps of:

by using a processor, calculating a shrinkage amount of the pattern on the imprint material, the pattern on the imprint material shrinking by desorbing condensate liquid from the imprint material after completion of the pressing step, the condensate liquid being produced through liquefaction of the condensable gas between the imprint material and the pattern of the mold in the pressing step and being dissolved in the imprint material; and determining a size of the pattern of the mold by using the calculated shrinkage amount.

2. The determination method according to claim 1, wherein, in the calculating step, the shrinkage amount is calculated by using a concentration of the condensate liquid dissolved in the imprint material and a relationship between the concentration and the shrinkage amount.

3. The determination method according to claim 2, wherein, in the calculating step, the concentration of the condensate liquid is obtained from a concentration of the condensable gas in the atmosphere.

4. The determination method according to claim 3, wherein, in the calculating step, a concentration distribution of the condensate liquid in a pattern area formed on the imprint material is obtained by using a concentration distribution of the condensable gas in the atmosphere, and wherein the shrinkage amount is calculated by using the concentration distribution of the condensate liquid.

5. The determination method according to claim 3, wherein, in the calculating step, a concentration distribution of the condensate liquid in a pattern area formed on the imprint material is obtained by using the amount of the condensable gas confined between the imprint material and the pattern of the mold in the pressing step, and wherein the shrinkage amount is calculated by using the concentration distribution of the condensate liquid.

6. The determination method according to claim 1, wherein, in the calculating step, the shrinkage amount is calculated for each of a plurality of pattern components whose sizes are different from each other.

7. The determination method according to claim 1, wherein, in the determining step, the size of the pattern of the mold is determined by using a shrinkage amount produced due to curing of the imprint material in the step of curing the imprint material.

8. A non-transitory recording medium storing a program for causing a computer to execute the determination method according to claim 1.

9. A computer including a processor that determines a pattern of a mold, wherein the mold is used in imprint processing of forming a pattern on imprint material by performing the steps of pressing the imprint material on a substrate against the pattern of the mold in an atmosphere containing condensable gas to be liquefied due to compression, curing the imprint material, and releasing the mold from the imprint material, and wherein the processor calculates a shrinkage amount of the pattern on the imprint material, the pattern on the imprint material shrinking by desorbing condensate liquid from the imprint material after completion of the pressing step, the condensate liquid being produced through liquefaction of the condensable gas between the imprint material and the pattern of the mold in the pressing step and being dissolved in the imprint material, and determines a size of the pattern of the mold by using the calculated shrinkage amount.

* * * * *